United States Patent
Mulder

(10) Patent No.: US 6,674,388 B2
(45) Date of Patent: Jan. 6, 2004

(54) HIGH SPEED ANALOG TO DIGITAL CONVERTER

(75) Inventor: Jan Mulder, Houten (NL)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/349,073

(22) Filed: Jan. 23, 2003

(65) Prior Publication Data

US 2003/0218558 A1 Nov. 27, 2003

Related U.S. Application Data

(63) Continuation of application No. 10/158,595, filed on May 31, 2002, now Pat. No. 6,573,853, which is a continuation-in-part of application No. 10/153,709, filed on May 24, 2002.

(51) Int. Cl.[7] .............................................. H03M 1/14
(52) U.S. Cl. ...................................... 341/158; 341/155
(58) Field of Search ................................ 341/158, 155, 341/156, 143

(56) References Cited

U.S. PATENT DOCUMENTS

| | | | | |
|---|---|---|---|---|
| 5,191,336 | A | 3/1993 | Stephenson | 341/111 |
| 5,973,632 | A | 10/1999 | Tai | 341/156 |
| 6,259,745 | B1 | 7/2001 | Chan | 375/285 |
| 6,489,913 | B1 | 12/2002 | Hansen | 341/156 |
| 6,573,853 | B1 * | 6/2003 | Mulder | 341/155 |

OTHER PUBLICATIONS

Abo, A.M. and Gray, P.R., "A 1.5–V, 10–bit, 14.3–MS/s CMOS Pipeline Analog–to–Digital Converter," *IEEE Journal of Solid–State Circuits*, IEEE, vol. 34, No. 5, May 1999, pp. 599–606.

Brandt, B.P. and Lutsky, J., "A 75–mW, 10–b, 20–MSPS CMOS Subranging ADC with 9.5 Effective Bits at Nyquist," *IEEE Journal of Solid–State Circuits*, IEEE, vol. 34, No. 12, Dec. 1999, pp. 1788–1795.

Bult, Klaas and Buchwald, Aaron, "An Embedded 240–mW 10–b 50–MS/s CMOS ADC in 1–mm$^2$," *IEEE Journal of Solid–State Circuits*, IEEE, vol. 32, No. 12, Dec. 1997, pp. 1887–1895.

Cho, T.B. and Gray, P.R., "A 10 b, 20 Msample/s, 35 mW Pipeline A/D Converter," *IEEE Journal of Solid–State Circuits*, IEEE, vol. 30, No. 3, Mar. 1995, pp. 166–172.

Choe, M–J. et al., "A 13–b 40–Msamples/s CMOS Pipelined Folding ADC with Background Offset Trimming," *IEEE Journal of Solid–State Circuits*, IEEE, vol. 35, No. 12, Dec. 2000, pp. 1781–1790.

Choi, M. and Abidi, A., "A 6–b 1.3–Gsample/s A/D Converter in 0.35–$\mu$m CMOS," *IEEE Journal of Solid–State Circuits*, IEEE, vol. 36, No. 12, Dec. 2001, pp. 1847–1858.

Flynn, M. and Sheahan, B., "A 400–Msample/s, 6–b CMOS Folding and Interpolating ADC," *IEEE Journal of Solid–State Circuits*, IEEE, vol. 33, No. 12, Dec. 1998, pp. 1932–1938.

(List continued on next page.)

Primary Examiner—Brian Young
(74) Attorney, Agent, or Firm—Sterne, Kessler, Goldstein & Fox, P.L.L.C.

(57) ABSTRACT

An analog to digital converter includes a reference ladder, a track-and-hold amplifier tracking an input signal with its output signal during the phase $\phi_1$ and holding a sampled value during, a coarse analog to digital converter having a plurality of coarse amplifiers each inputting a corresponding tap from the reference ladder and the output signal, a fine analog-to-digital converter having a plurality of fine amplifiers inputting corresponding taps from the reference ladder and the output signal, the taps selected based on outputs of the coarse amplifiers, a clock having phases $\phi_1$ and $\phi_2$, a circuit responsive to the clock that receives the output signal, the circuit substantially passing the output signal and the corresponding taps to the fine amplifiers during the phase $\phi_2$ and substantially rejecting the output signal and the corresponding taps during the phase $\phi_1$, and an encoder converting outputs of the coarse and fine amplifiers to an N-bit digital signal representing the input signal.

34 Claims, 8 Drawing Sheets

OTHER PUBLICATIONS

Geelen, G., "A 6b 1.1GSample/s CMOS A/D Converter," *IEEE International Solid–State Circuits Conference*, IEEE, 2001, pp. 128–129 and 438.

Hoogzaad, G. and Roovers, R., "A 65–mW, 10–bit, 40–Msample/s BiCMOS Nyquist ADC in 0.8 mm$^2$," *IEEE Journal of Solid–State Circuits*, IEEE, vol. 34, No. 12, Dec. 1999, pp. 1796–1802.

Hosotani, S. et al., "An 8–bit 20–MS/s CMOS A/D Converter with 50–mW Power Consumption," *IEEE Journal of Solid–State Circuits*, IEEE, vol. 25, No. 1, Feb. 1990, pp. 167–172.

Ingino, J.M. and Wooley, B.A., "A Continuously Calibrated 12–b, 10–MS/s, 3.3–V A/D Converter," *IEEE Journal of Solid–State Circuits*, IEEE, vol. 33, No. 12, Dec. 1998, pp. 1920–1931.

Ito, M. et al., "A 10 bit 20 MS/s 3 V Supply CMOS A/D Converter," *IEEE Journal of Solid–State Circuits*, IEEE, vol. 29, No. 12, Dec. 1994, pp. 1531–1536.

Kattman, K. and Barrow, J., "A Technique for Reducing Differential Non–Linearity Errors in Flash A/D Converters," *IEEE International Solid–State Conference*, IEEE, 1991, pp. 170–171.

Kusumoto, K. et al., "A 10–b 20–MHz 30–mW Pipelined Interpolating CMOS ADC," *IEEE Journal of Solid–State Circuits*, IEEE, vol. 28, No. 12, Dec. 1993, pp. 1200–1206.

Lewis, S. et al., "A 10–b 20–Msample/s Analog–to–Digital Converter," *IEEE Journal of Solid–State Circuits*, IEEE, vol. 27, No. 3, Mar. 1992, pp. 351–358.

Mehr, I. and Singer, L., "A 55–mW, 10–bit, 40–Msample/s Nyquist–Rate CMOS ADC," *IEEE Journal of Solid–State Circuits*, IEEE, vol. 35, No. 3, Mar. 2000, pp. 318–325.

Nagaraj, K. et al., "Efficient 6–Bit A/D Converter Using a 1–Bit Folding Front End," *IEEE Journal of Solid–State Circuits*, IEEE, vol. 34, No. 8, Aug. 1999, pp. 1056–1062.

Nagaraj, K. et al., "A Dual–Mode 700–Msamples/s 6–bit 200–Msamples/s 7–bit A/D Converter in a 0.25–μm Digital CMOS," *IEEE Journal of Solid–State Circuits*, IEEE, vol. 35, No. 12, Dec. 2000, pp. 1760–1768.

Nauta, B. and Venes, A., "A 70–MS/s 110–mW 8–b CMOS Folding and Interpolating A/D Converter," *IEEE Journal of Solid–State Circuits*, IEEE, vol. 30, No. 12, Dec. 1995, pp. 1302–1308.

Pan, H. et al., "A 3.3–V 12–b 50–MS/s A/D Converter in 0.6–μm CMOS with over 80–dB SFDR," *IEEE Journal of Solid–State Circuits*, IEEE, vol. 35, No. 12, Dec. 2000, pp. 1769–1780.

Song, W–C. et al., "A 10–b 20–Msample/s Low–Power CMOS ADC," *IEEE Journal of Solid–State Circuits*, IEEE, vol. 30, No. 5, May 1995, pp. 514–521.

Sumanen, L. et al., "A 10–bit 200–MS/s CMOS Parallel Pipeline A/D Converter," *IEEE Journal of Solid–State Circuits*, IEEE, vol. 36, No. 7, Jul. 2001, pp. 1048–1055.

Taft, R.C, and Tursi, M.R., "A 100–MS/s 8–b CMOS Subranging ADC with Sustained Parametric Performance from 3.8 V Down to 2.2 V," *IEEE Journal of Solid–State Circuits*, IEEE, vol. 36, No. 3, Mar. 2001, pp. 331–338.

van der Ploeg, H. and Remmers, R., "A 3.3–V, 10–b 25–Msample/s Two–Step ADC in 0.35–μm CMOS," *IEEE Journal of Solid–State Circuits*, IEEE, vol. 34, No. 12, Dec. 1999, pp. 1803–1811.

van der Ploeg, H. et al., "A 2.5–V 12–b 54–Msample/s 0.25–μm CMOS ADC in 1–mm$^2$ With Mixed–Signal Chopping and Calibration," *IEEE Journal of Solid–State Circuits*, IEEE, vol. 36, No. 12, Dec. 2001, pp. 1859–1867.

Vorenkamp, P. and Roovers, R., "A 12–b, 60–Msampl/s Cascaded Folding and Interpolating ADC," *IEEE Journal of Solid–State Circuits*, IEEE, vol. 32, No. 12, Dec. 1997, pp. 1876–1886.

Wang, Y–T. and Razavi, B., "An 8–bit 150–MHz CMOS A/D Converter," *IEEE Journal of Solid–State Circuits*, IEEE, vol. 35, No. 3, Mar. 2000, pp. 308–317.

Yotsuyanagi, M. et al., "A 2 V, 10 b, 20 Msample/s, Mixed–Mode Subranging CMOS A/D Converter," *IEEE Journal of Solid–State Circuits*, IEEE, vol. 30, No. 12, Dec. 1995, pp. 1533–1537.

Yu, P.C. amd Lee, H–S., "2.5–V, 12–b, 5–Msample/s Pipelined CMOS ADC," *IEEE Journal of Solid–State Circuits*, IEEE, vol. 31, No. 12, Dec. 1996, pp. 1854–1861.

Miyazaki et al., ISSCC 2002/Session 10/High–Speed ADCs/ 10.5, "A 16mW 30 MSample/s 10b Pipelined A/D Converter using a Pseudo–Differential Architecture", Feb. 5, 2002, 3 pgs.

Sushihara et al., ISSCC 2002/Session 10/High–Speed ADCs/10.3, "A 7b 450 MSample/s 50mW CMOS ADC in 0.3 mm$^2$", Feb. 5, 2002, 3 pgs.

Dingwall et al., IEEE Journal of Solid–State Circuits, vol. SC–20, No. 6, "An 8–Mhz CMOS Subranging 8–Bit A/D Converter", Dec. 1985, pp. 1138–1143.

* cited by examiner

1

HIGH SPEED ANALOG TO DIGITAL CONVERTER

This application is a unit of Ser. No. 10/158,595 filed May 31, 2002, U.S. Pat. No. 6,573,853 which is a C.I.P of Ser. No. 10/153,709 filed May 24, 2002.

CROSS-REFERENCE TO RELATED APPLICATIONS

This application is a Continuation-in-Part of Application Ser. No. 10/460,622 Filed: May 24, 2002, Titled: DISTRIBUTED AVERAGING ANALOG TO DIGITAL CONVERTER TOPOLOGY, Inventors: MULDER et al. and is related to Application Ser. No. 10/158,774, Filed: May 31, 2002; Titled: ANALOG TO DIGITAL CONVERTER WITH INTERPOLATION OF REFERENCE LADDER, Inventors: MULDER et al. Application Ser. No. 10/158,193, Filed: May 31, 2002, Titled: CLASS AB DIGITAL TO ANALOG CONVERTER/LINE DRIVER, Inventors: Jan MULDER et al. and Application Ser. No. 10/158,733, Filed: May 31, 2002, Inventor: Jan MULDER; Titled: SUBRANGING ANALOG TO DIGITAL CONVERTER WITH MULTI-PHASE CLOCK TIMING, Inventors: van der GOES et al. all of which are incorporated by reference herein.

BACKGROUND OF THE INVENTION

1. Field of the Invention

The present invention relates to analog to digital converters (ADC's), and more particularly, to reducing nonlinearities and inter-symbol interference in high-speed analog to digital converters.

2. Related Art

A subranging analog to digital converter (ADC) architecture is suitable for implementing high-performance ADC's (i.e. high speed, low power, low area, high resolution). FIG. 1 shows a generic two-step subranging architecture, comprising a reference ladder 104, a coarse ADC 102, a switching matrix 103, a fine ADC 105, coarse comparators 107, fine comparators 108 and an encoder 106. In most cases, a track-and-hold 101 is used in front of the ADC. In this architecture, an input voltage is first quantized by the coarse ADC 102. The coarse ADC 102 compares the input voltage against all the reference voltages, or against a subset of the reference voltages that is uniformly distributed across the whole range of reference voltages. Based on a coarse quantization, the switching matrix 103 connects the fine ADC 105 to a subset of the reference voltages (called a "subrange") that is centered around the input signal voltage.

Modem flash, folding and subranging analog to digital converters (ADC's) often use averaging techniques for reducing offset and noise of amplifiers used in the ADC. One aspect of averaging is the topology that is used to accomplish averaging, i.e., which amplifier outputs in which arrays of amplifiers are averaged together.

In general, flash, folding and subranging ADC's use cascades of distributed amplifiers to amplify the residue signals before they are applied to the comparators. These residue signals are obtained by subtracting different DC reference voltages from an input signal $V_{in}$. The DC reference voltages are generated by the resistive ladder (reference ladder) 104 biased at a certain DC current.

High-resolution ADC's often use auto-zero techniques, also called offset compensation techniques, to suppress amplifier offset voltages. In general, autozeroing requires two clock phases ($\phi_1$ and $\phi_2$). During the auto-zero phase, the amplifier offset is stored on one or more capacitors, and during the amplify phase, the amplifier is used for the actual signal amplification.

Two different auto-zero techniques can be distinguished, which are illustrated in FIGS. 2 and 3. The technique shown in FIG. 2 connects an amplifier 201 in a unity feedback mode during the auto-zero clock phase $\phi_1$. As a result, a large part of the amplifier 201 input offset voltage is stored on input capacitors C1a, C1b. The remaining offset is stored on output capacitors C2a, C2b if available.

The second technique, shown in FIG. 3, shorts the amplifier 201 inputs during the auto-zero phase $\phi_1$ and connects them to a DC bias voltage $V_{res}$. Here, the amplifier 201 output offset voltage is stored on the output capacitors C2a, C2b. Many ADC architectures use a cascade of several (auto-zero) amplifiers to amplify the input signal prior to applying to the comparators 107, 108. In general, flash, folding and subranging ADC's use arrays of cascaded amplifiers, and averaging and interpolation techniques are used to improve performance.

Unfortunately, the performance of cascaded arrays of amplifiers degrades significantly at high clock and input signal frequencies. The cause of this degradation is illustrated in FIG. 4 when the reset technique shown in FIG. 3 is used, and where $R_{SW}$ is shown as a circuit element, and the current flow $I_C$ is explicitly shown.

When the amplifier 201 is in the auto-zero phase $\phi_1$, the input capacitors C1a, C1b are charged to the voltage $V_{sample}$ that is provided by the track-and-hold amplifier 101. As a result, a current $I_C$ will flow through the input capacitors C1a, C1b and an input switch (not shown). Due to the finite on-resistance $R_{SW}$ of the input switch (see FIG. 4), an input voltage is generated, which will settle exponentially towards zero. This input voltage is amplified by the amplifier 201 and results in an output voltage that also slowly settles towards zero (assuming the amplifier 201 has zero offset).

Essentially, the auto-zero amplifier 201 is in a "reset" mode one-half the time, and in an "amplify" mode the other one-half the time. When in reset mode, the capacitors C1a, C1b are charged to the track-and-hold 101 voltage, and the current $I_C$ flows through the capacitors C1a, C1b and the reset switches, so as to charge the capacitors C1a, C1b.

When the ADC has to run at high sampling rates, there is not enough time for the amplifier 201 output voltage to settle completely to zero during the reset phase. As a result, an error voltage is sampled at the output capacitors C2a, C2b that is dependent on the voltage $V_{sample}$. This translates into non-linearity of the ADC, and often causes inter-symbol interference (ISI).

The problem of ISI occurs in most, if not all, ADC architectures and various approaches exist for attacking the problem. The most straightforward approach is to decrease the settling time constants. However, the resulting increase in power consumption is a major disadvantage.

Another approach is to increase the time allowed for settling, by using interleaved ADC architectures. However, this increases required layout area. Furthermore, mismatches between the interleaved channels cause spurious tones. The ISI errors can also be decreased by resetting all cascaded amplifiers during the same clock phase. Unfortunately, this is not optimal for high speed operation either.

SUMMARY OF THE INVENTION

The present invention is directed to an analog to digital converter topology that substantially obviates one or more of the problems and disadvantages of the related art.

There is provided an analog to digital converter including a reference ladder, a clock having phases $\phi_1$ and $\phi_2$, and a track-and-hold amplifier tracking an input signal with its output signal during the phase $\phi_1$ and holding a sampled value during the phase $\phi_2$. A plurality of coarse amplifiers each input a corresponding tap from the reference ladder and the output sign. A plurality of fine amplifiers input corresponding taps from the reference ladder and a signal corresponding to the output signal, the taps selected based on outputs of the coarse amplifiers. A circuit responsive to the clock receives the signal corresponding to the output signal, the circuit substantially passing the signal corresponding to the output signal and the corresponding taps to the fine amplifiers during the phase $\phi_2$ and substantially rejecting the signal corresponding to the output signal during the phase $\phi_2$. An encoder converts outputs of the coarse and fine amplifiers to an N-bit digital signal representing the input signal.

In another aspect of the present invention there is provided an analog to digital converter including a reference ladder and a two-phase clock having phases $\phi_1$ and $\phi_2$. A track-and-hold amplifier tracking an input signal with its output signal during the phase $\phi_1$ and holding a sampled value during the phase ($\phi_2$. A plurality of coarse amplifiers each inputting a signal corresponding to the output signal and a corresponding tap from the reference ladder. A switching circuit that receives the signal corresponding to the output signal and has a differential mode transfer function of approximately 1 on the phase $\phi_2$ and approximately 0 on the phase $\phi_1$. A plurality of fine amplifiers inputting corresponding taps from the reference ladder and the signal corresponding to the output signal through the switching circuit, the taps selected based on outputs of the coarse amplifiers. An encoder converts outputs of the coarse and fine amplifiers to an N-bit digital signal representing the input signal.

In another aspect of the present invention there is provided an analog to digital converter including a reference ladder and a multi-phase clock. A track-and-hold amplifier tracking an input signal with its output signal during one phase of the multi-phase clock and holding a sampled value during another phase of the multi-phase clock. A plurality of coarse amplifiers each inputting a signal corresponding to the output signal and a corresponding tap from the reference ladder. Switching means that receives the signal corresponding to the output signal and responsive to the multi-phase clock, the means substantially passing the signal corresponding to the output signal to the fine amplifiers during the one phase and substantially rejecting the signal corresponding to the output signal during the another phase. A plurality of fine amplifiers inputting, through the switching means, corresponding taps from the reference ladder and the output signal, the taps selected based on outputs of the coarse amplifiers. An encoder converts outputs of the coarse and fine amplifiers to an N-bit digital signal representing the input signal.

An analog to digital converter including a track-and-hold amplifier whose output signal tracks an input signal during one clock phase, and holds a sampled value during another clock phase. A coarse amplifier inputting the output signal and a coarse tap. A transfer matrix that substantially passes a signal corresponding to the output signal during the one clock phase and substantially blocks the signal corresponding to the output signal during the another clock phase. A fine amplifier inputting a fine tap and the output signal through the transfer matrix, the fine tap selected based on an output of the coarse amplifier. An encoder converts outputs of the coarse and fine amplifiers to an N-bit digital signal representing the input signal.

An analog to digital converter including a differential coarse amplifier inputting a signal corresponding to an input signal and a coarse tap during one clock phase, and a sampled value during another clock phase. A plurality of cross-coupled transistors that substantially pass the first signal and a fine tap during the one clock phase and substantially block the first signal and the fine tap during the another clock phase, the fine tap selected based on a signal from the differential coarse amplifier. A differential fine amplifier inputting an output of the plurality of cross-coupled transistors. An encoder converts outputs of the coarse and fine amplifiers to an N-bit digital signal representing the input signal.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
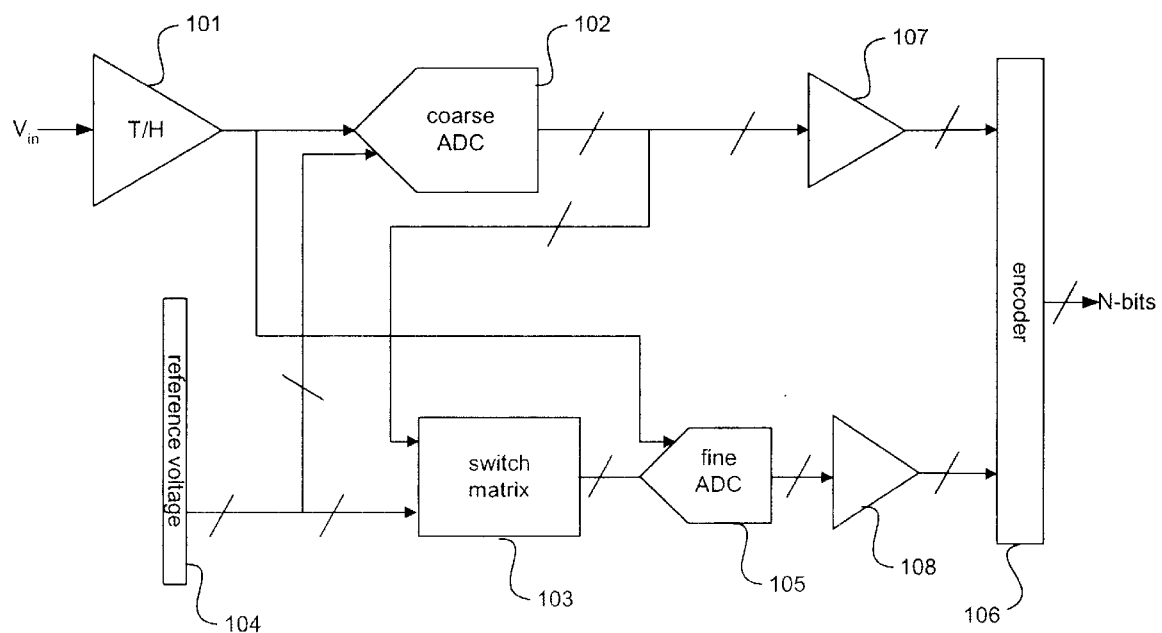
FIG. 1 illustrates a conventional averaging topology.
Figure 2:
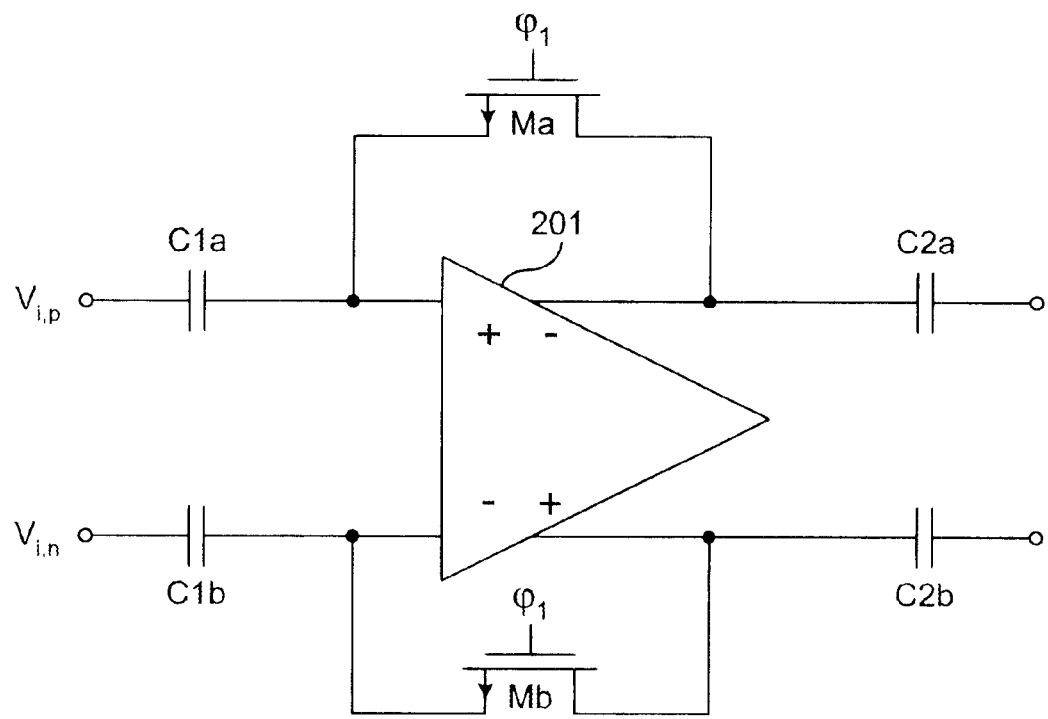
FIGS. 2 and 3 illustrate conventional amplifier topologies with reset switches.

Recently, a technique to address the nonlinearity was published by Miyazaki et al., "A 16 mW 30 M Sample/s pipelined A/D converter using a pseudo-differential architecture," *ISSCC Digest of Tech. Papers*, pp. 174–175 (2002), see particularly FIG. 10.5.2 therein. The technique applies only to amplifiers that use the auto-zero technique of FIG. 2.

In Miyazaki, four extra switches and two extra capacitors are required. The resulting circuit topology has a common-mode transfer function of "1" and differential-mode transfer function of "0" during the reset clock phase.

However, an important disadvantage of the circuit shown in Miyazaki is that it requires twice the amount of capacitance. This has a serious impact on the ADC layout area. Furthermore, the capacitive loading of the track-and-hold 101 doubles, which significantly slows down the charging of the capacitors C1$a$, C1$b$ (roughly by a factor of two).

Figure 5:
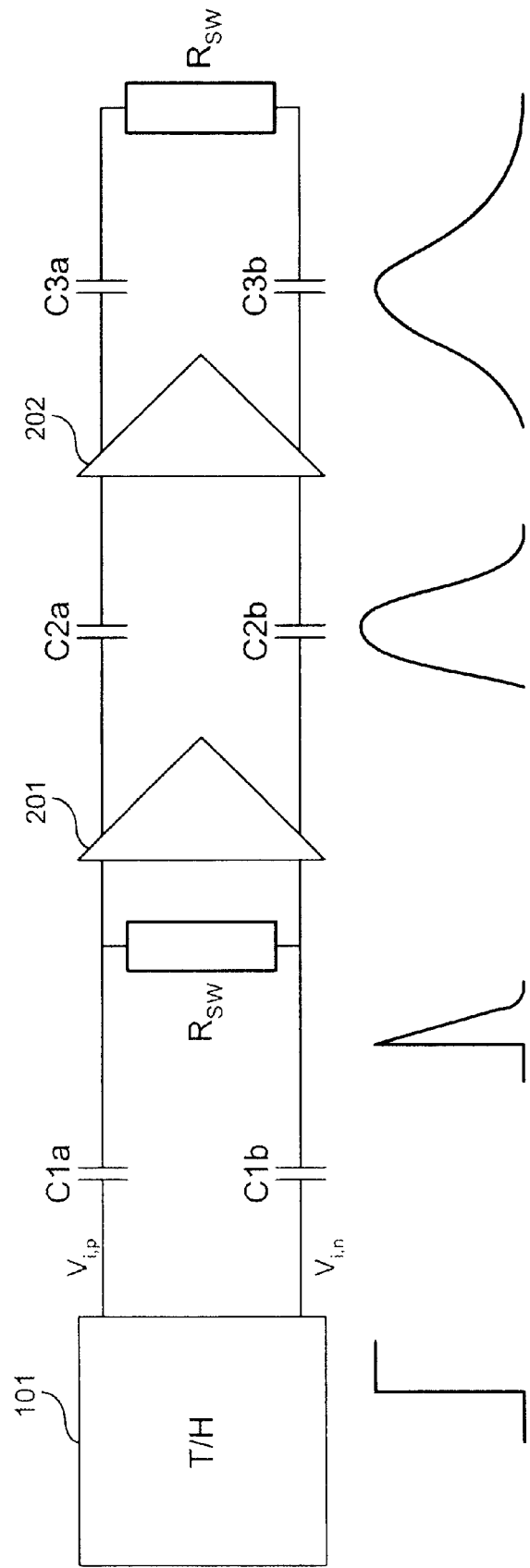
FIG. 5 illustrates a source of inter-symbol interference in greater detail.

FIG. 5 shows the rationale for the present invention. In FIG. 5, the track-and-hold amplifier 101 outputs a step function to the sampling capacitors C1$a$, C1$b$. Due to the finite resistance $R_{SW}$, the pulse becomes a spike (i.e., it is effectively high-pass filtered) by the time it gets to the amplifier 201, which is the first amplifier in a cascade. The next set of capacitors C2$a$, C2$b$ sees a "smeared-out" pulse, which, by the time it is amplified by the next amplifier in a cascade (amplifier 202), and charges the next stage capacitors C3$a$ and C3$b$, becomes further "smeared-out". The spike being transferred throughout the cascaded amplifiers causes inter-symbol interference.

Figure 3:
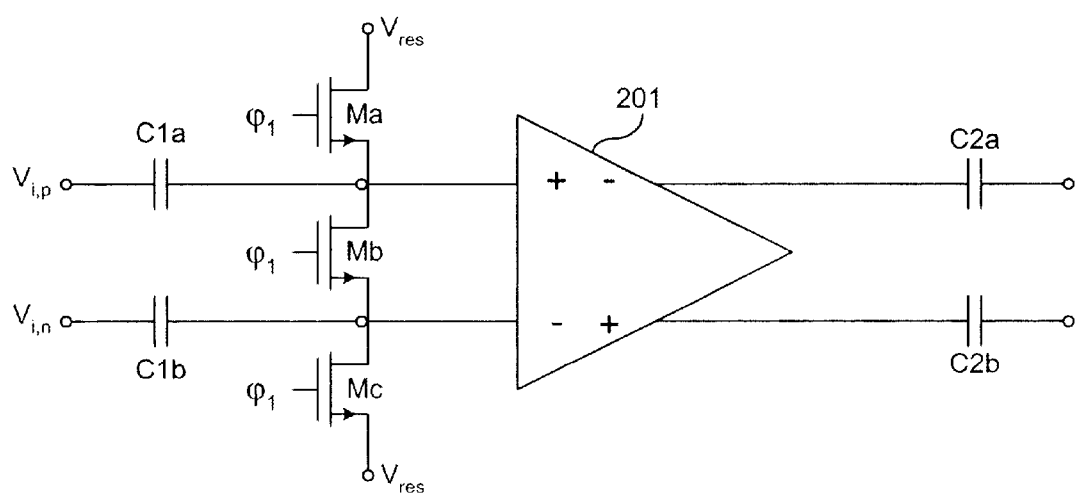
Figure 4:
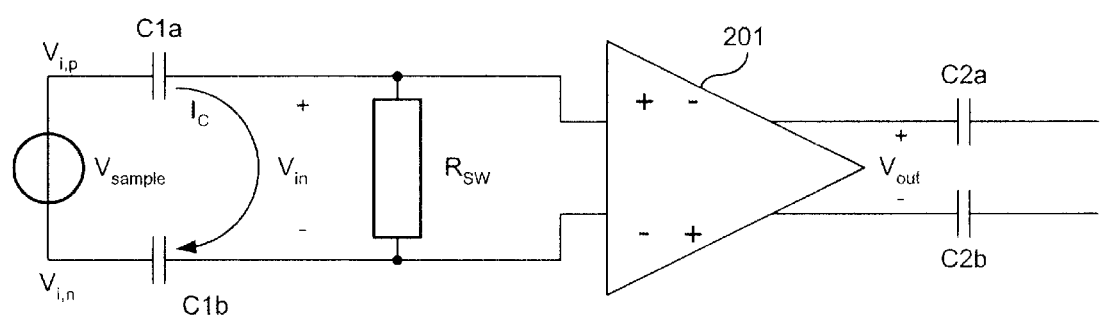
FIG. 4 illustrates a conventional amplifier topology and the source of the inter-symbol interference problem.
Figure 6:
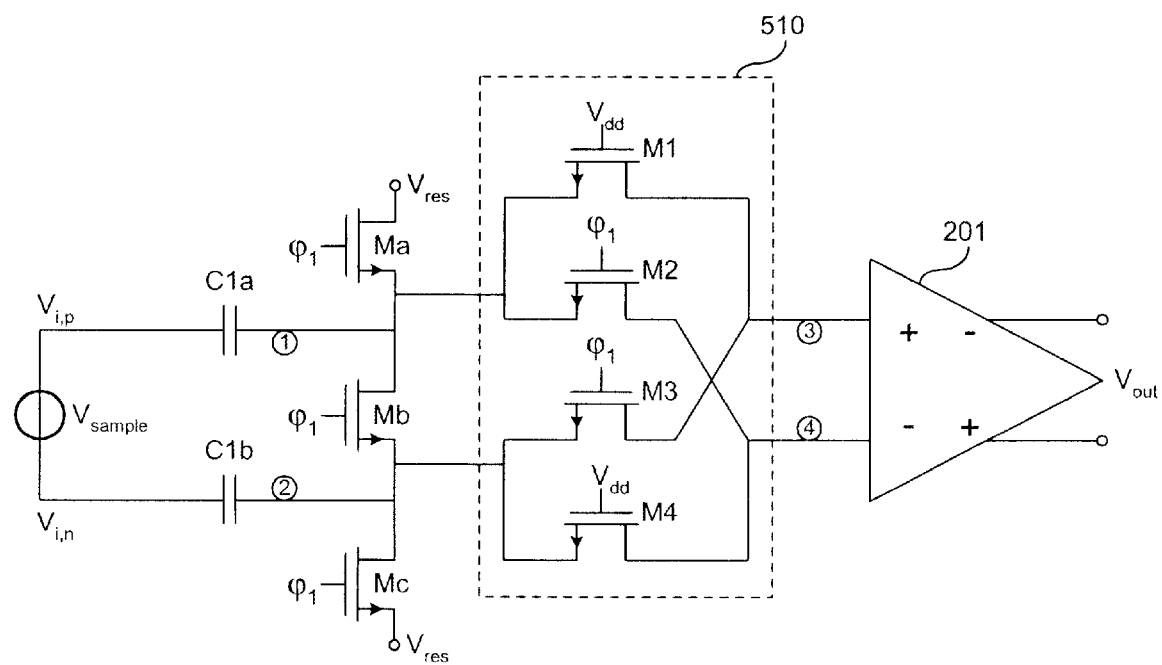
FIG. 6 illustrates one embodiment of the present invention.
Figure 7:
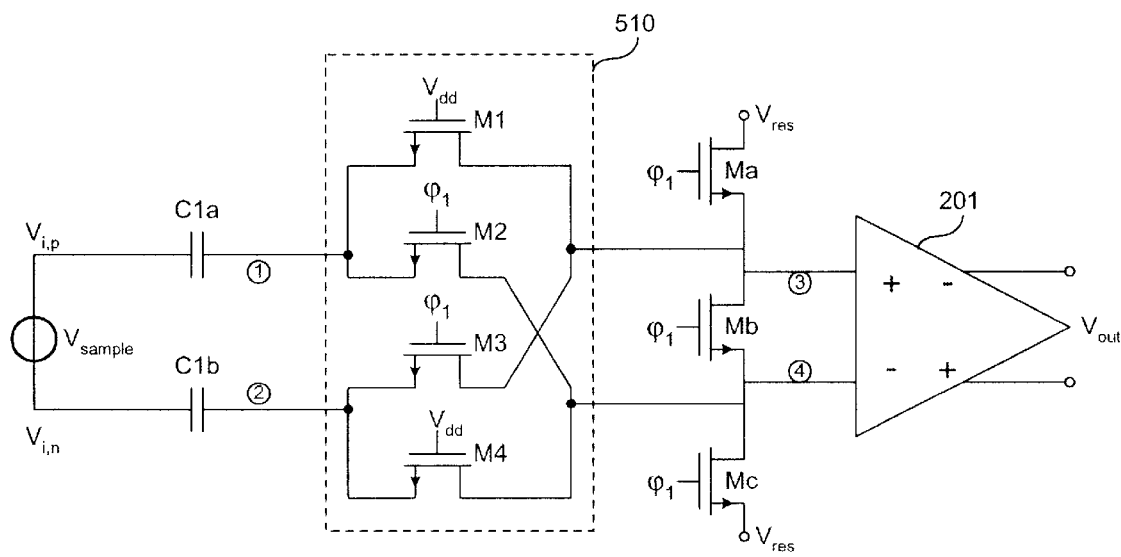
FIG. 7 illustrates another embodiment of the present invention.

The problem of ISI can be solved in a very elegant way by complementing the reset switches shown in FIG. 3 with some additional switches before the fine amplifiers of the fine ADC 105. The resulting circuit is shown in FIG. 6. The extra switches are contained in the dashed box 510 (a transfer matrix or transfer circuit). FIG. 7 shows a modification of the new circuit that works in a similar way.

The transfer circuit shown in the dashed box 510 has a transfer function of "1" for common-mode signals at all times, so that the common mode transfer function is $H_{CM}((\phi_1)=1, H_{CM}(\phi_2)=1$. However, the transfer function varies for differential signals depending on the clock phase ($\phi_1$ or $\phi_2$) More specifically, the transfer function for differential signals is $H_{DM}(\phi_1)=0$, and $H_{DM}(\phi_2)=1$. Hence, a differential voltage created across nodes ① and ② (due to the charging of the input capacitors C1$a$, C1$b$) is not transferred to input nodes ③ and ④ of the amplifier 201 during $\phi_1$. Therefore, the output voltage of the amplifier 201 is not affected by $V_{sample}$ in any way, reducing the occurrence of ISI. The input capacitors C1$a$, C1$b$ subtract track-and-hold amplifier 101 voltage from a reference ladder 104 voltage.

The technique presented herein can find application in various types of ADC architectures that use auto-zero techniques for combating amplifier offsets.

FIG. 6 shows one embodiment of the present invention. $\phi_1$ and $\phi_2$ represent two phases of a clock, preferably non-overlapping phases. As shown in FIG. 6, the sampling voltage $V_{sample}$ is differentially connected to two sampling capacitors C1$a$ and C1$b$, which are in turn connected to three switch transistors Ma, Mb and Mc. Gates of the switch transistors Ma, Mb, Mc are connected to $\phi_1$, a drain of the transistor Ma is connected to $V_{res}$, and a source of the transistor Mc is connected to the reset voltage $V_{res}$. Between the amplifier 201 and the switch transistors Ma, Mb, Mc, the transfer matrix 510 comprises four transistors M1, M2, M3 and M4. Gates of the transistors M2 and M3 are connected to $\phi_1$. Gates of the transistors M1 and M4 are connected to $V_{dd}$, the supply voltage. Sources of the transistors M1 and M2 are tied together and to the node ①, which is also connected to the sampling capacitor C1$a$. Sources of the transistors M3 and M4 are tied together and also connected to a node ②, which is also connected to the sampling capacitor C1$b$. Drains of the transistors M3 and M1 are tied together and to node ③, which is the "+" input of the amplifier 201. Drains of the transistors M2 and M4 are tied together and to node ④, which is also connected to the "−" input of the amplifier 201.

Thus, the circuit within the dashed box 510 may be referred to as a transfer matrix that has a property such that its differential mode transfer function $H(\phi_1)=0$, $H((\phi_2)=1$.

This is different from a conventional approach, where the transfer function may be thought of as being H=1 for both $\phi_1$ and $\phi_2$.

It will be appreciated that while the overall transfer function of the transfer matrix 510 is $H_{DM}(\phi_1)=0, H_{DM}(\phi_2)=1, H_{CM}(\phi_1)=1, H_{CM}(\phi_2)=1$, this is primarily due to the switches M1–M4, which essentially pass the differential voltage of nodes ① and ② through to nodes ③ and ④, respectively, on $\phi_2$. However, the gain factor need not be exactly 1, but may be some other value. The important thing is that it be substantially 0 on $\phi_1$.

FIG. 7 represents another embodiment of the present invention. The elements of FIG. 7 correspond to the same-numbered elements of FIG. 6, however, the position of the transfer matrix 510 is before the three transistors Ma, Mb and Mc, rather than after. This results in lower noise operation, compared to the embodiment shown in FIG. 6. The embodiment shown in FIG. 6, however, generally allows for higher frequency operation, compared to the embodiment of FIG. 7.

Note that either PMOS or NMOS transistors may be used as switches in the present invention. Note further that given the use of the FET transistors as switches (rather than the amplifiers), the drain and the source function equivalently.

Figure 8:
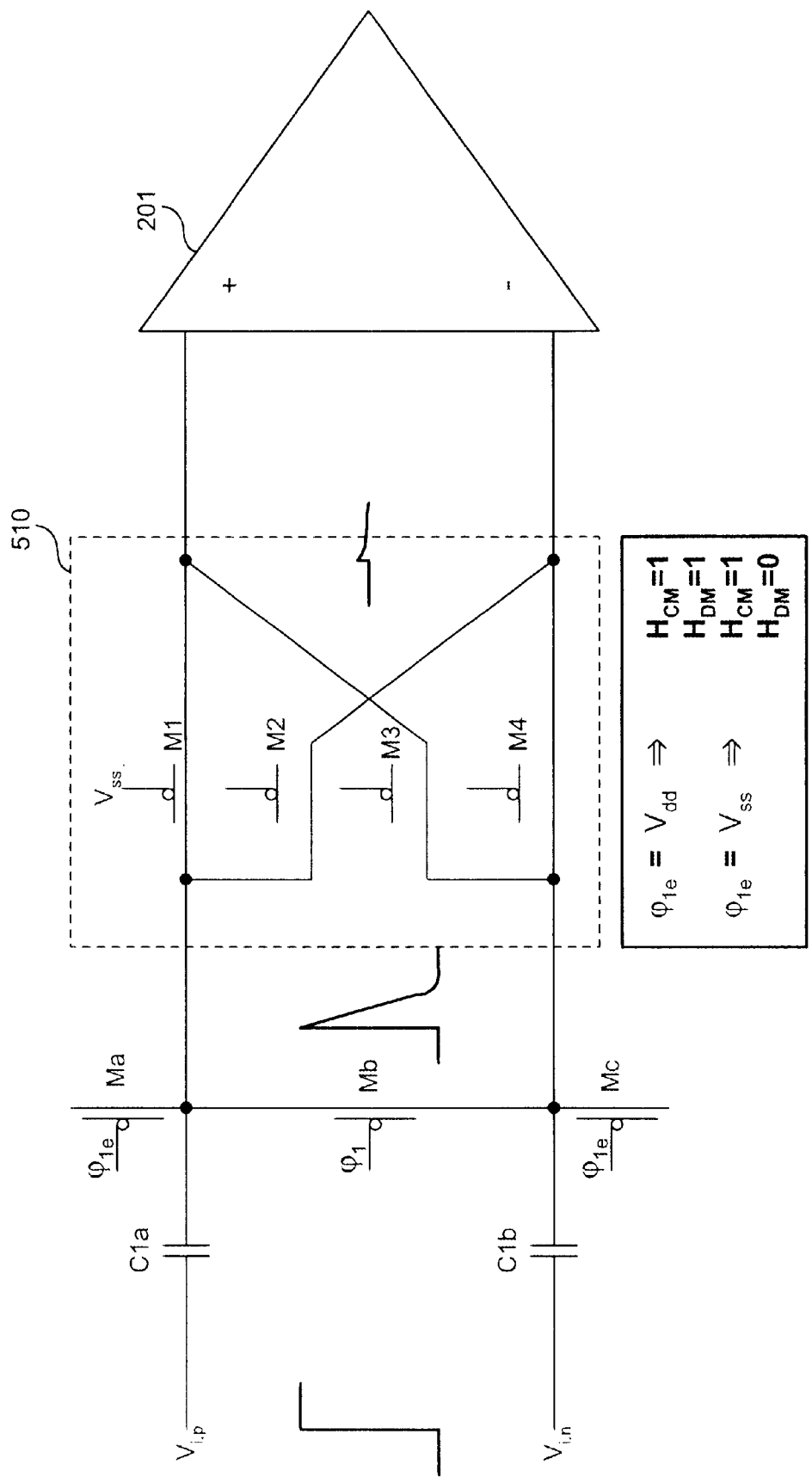
FIG. 8 illustrates a reduction in inter-symbol interference using the present invention.

FIG. 8 illustrates the improvement in the signal due to the transfer matrix 510. Note that the transistors Ma, Mb, Mc and the transistors of the transfer matrix M1–M4, are PMOS transistors, with the negative supply $V_{ss}$ used instead of the positive supply $V_{dd}$. As may be seen from FIG. 8, the amount of spike seen by the amplifier 201 after a step function outputted from the track-and-hold 101 is dramatically decreased due to the transfer function of the transfer matrix 510. $\phi_1$, in FIG. 8 refers to an "early" phase $\phi_1$ of the two-phase clock. The small spike seen in FIG. 8 is due to a mis-match of the transistors M1–M4, and disappears entirely if the transistors are made bigger. In the event there is no spike (i.e., the transistors M1–M4 are perfectly matched), an approximately 50% improvement in speed is expected.

Note further that in the event of using a plurality of cascaded amplifier stages for a pipeline architecture (designated A, B, C, D), if the A and B stage switches are driven by the phase $\phi_1$, and the C and D stages are driven by $\phi_2$, the transfer matrix 510 is only needed for the A stage and the C stage. On the other hand, if the switches of the stages A, B, C and D are driven by alternating clock phases (i.e., $\phi_1, \phi_2, \phi_1, \phi_2$, each stage will need its own transfer matrix 510.

It will be appreciated that the various aspects of the invention as further disclosed in related Application Ser. No. 10/153,709, Filed: May 24, 2002, Titled: DISTRIBUTED AVERAGING ANALOG TO DIGITAL CONVERTER TOPOLOGY, Inventors: MULDER et al.; Application Ser. No. 10/158,193, Filed: May 31, 2002; Titled: CLASS AB DIGITAL TO ANALOG CONVERTER/LINE DRIVER, Inventors: Jan MULDER et al.; Application Ser. No. 10/158, 779, Filed: May 31, 2002, Titled: ANALOG TO DIGITAL CONVERTER WITH INTERPOLATION OF REFERENCE LADDER, Inventors: MULDER et al.; and Application Ser. No. 10/158,774, Filed: May 31, 2002, Inventor: Jan MULDER; Titled: SUBRANGING ANALOG TO DIGITAL CONVERTER WITH MULTI-PHASE CLOCK TIMING, Inventors: van der GOES et al., all of which are incorporated by reference herein, may be combined in various ways, or be integrated into a single integrated circuit or product.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An analog to digital converter comprising:
    a track-and-hold amplifier tracking an input signal with its output signal during a clock phase $\phi_1$ and holding a sampled value during a clock phase $\phi_2$;
    a plurality of amplifiers inputting reference voltages and a signal corresponding to the output signal;
    a circuit that receives the signal corresponding to the output signal, the circuit substantially passing the signal corresponding to the output signal and the reference voltages to the amplifiers during the clock phase $\phi_2$ and substantially rejecting the signal corresponding to the output signal during the clock phase $\phi_1$; and
    an encoder converting outputs of the amplifiers to an N-bit digital signal representing the input signal.

2. The analog to digital converter of claim 1, wherein, for each amplifier, the circuit includes a plurality of transistors driven by either a supply voltage or the clock phase $\phi_1$.

3. The analog to digital converter of claim 2, wherein the transistors are FET transistors.

4. The analog to digital converter of claim 1, wherein, for each amplifier, the circuit includes two cross-coupled transistors, two signal inputs and two signal outputs, the two signal outputs differentially connected to differential inputs of each corresponding amplifier, the two signal inputs differentially connected to the output signal of the track-and-hold amplifier.

5. The analog to digital converter of claim 1, wherein the output signal includes positive and negative differential outputs of the track-and-hold amplifier,
    wherein the circuit includes first, second, third and fourth transistors,
    wherein sources of the first and second transistors are connected to a positive differential output of the track-and-hold amplifier through a first sampling capacitor,
    wherein sources of the third and fourth transistors are connected to a negative differential output of the track-and-hold amplifier through a second sampling capacitor,
    wherein drains of the first and third transistors are connected to a positive differential input of the each amplifier,
    wherein drains of the second and fourth transistors are connected to a negative differential input of the each amplifier, and
    wherein gates of the second and third transistors are driven by the clock phase $\phi_1$.

6. The analog to digital converter of claim 5, wherein the transistors are FET transistors.

7. The analog to digital converter of claim 1, wherein the output signal includes positive and negative differential outputs of the track-and-hold amplifier, and
    further including a transistor connected between the positive and negative differential outputs of the track and hold amplifier, a gate of the transistor being driven by the clock phase $\phi_1$.

8. The analog to digital converter of claim 7, wherein the transistor is a FET transistor.

9. The analog to digital converter of claim 7, further including:
    a first reset transistor connected between a reset voltage and the positive differential output;
    a second reset transistor connected between the reset voltage and the negative differential output,
    wherein gates of the first and second reset transistors are driven by the clock phase $\phi_1$.

10. The analog to digital converter of claim 9, wherein the first and second reset transistors are FET transistors.

11. The analog to digital converter of claim 7, further including sampling capacitors at the positive and negative differential outputs of the track-and-hold amplifier.

12. The analog to digital converter of claim 1, wherein a transfer function of the circuit for differential mode is $H_{DM}(\phi_1)=0$, $H_{DM}(\phi_2)=1$, and a transfer function for common mode is $H_{CM}(\phi_1)=1$, $H_{CM}(\phi_2)=1$.

13. The analog to digital converter of claim 1, wherein each of the amplifiers includes a plurality of amplifier stages, and
    wherein the circuit is coupled to an input of a first stage for each amplifier.

14. The analog to digital converter of claim 1, wherein each of the amplifiers includes a plurality of amplifier stages, and
    wherein the circuit is coupled to inputs of each stage.

15. The analog to digital converter of claim 1, wherein each of the amplifiers includes a plurality of amplifier stages, and
    wherein the circuit is coupled to inputs of alternating stages.

16. The analog to digital converter of claim 1, further including a sampling capacitor at each input of the amplifiers for sampling the output of the track-and-hold amplifier.

17. An analog to digital converter comprising:
    a track-and-hold amplifier tracking an input signal with its output signal during a clock phase $\phi_1$ and holding a sampled value during a clock phase $\phi_2$;
    a first plurality of amplifiers each inputting a signal corresponding to the output signal and a reference voltage;
    a switching circuit that receives the signal corresponding to the output signal and has a differential mode transfer function of approximately 1 on the clock phase $\phi_2$ and approximately 0 on the clock phase $\phi_1$;
    a second plurality of amplifiers inputting the reference voltages and the signal corresponding to the output signal through the switching circuit, the reference voltages selected based on outputs of the first plurality of amplifiers; and
    an encoder converting outputs of the first and second plurality of amplifiers to an N-bit digital signal representing the input signal.

18. The analog to digital converter of claim 17, wherein, for each amplifier of the second plurality of amplifiers, the circuit includes a plurality of transistors driven by either a supply voltage or the clock phase $\phi_1$.

19. The analog to digital converter of claim 18, wherein the transistors are FET transistors.

20. The analog to digital converter of claim 17, wherein, for each amplifier of the second plurality of amplifiers, the switching circuit includes two cross-coupled transistors, two signal inputs and two signal outputs, the two signal outputs differentially connected to differential inputs of each corresponding amplifier of the second plurality of amplifiers, the two signal inputs differentially connected to the output signal of the track-and-hold amplifier.

21. The analog to digital converter of claim 17, wherein the output signal includes positive and negative differential outputs of the track-and-hold amplifier, wherein the switching circuit includes first, second, third and fourth transistors, wherein sources of the first and second transistors are connected to a positive differential output of the track-and-hold amplifier through a first sampling capacitor, wherein sources of the third and fourth transistors are connected to a negative differential output of the track-and-hold amplifier through a second sampling capacitor, wherein drains of the first and third transistors are connected to a positive differential input of the each amplifier of the second plurality of amplifiers, wherein drains of the second and fourth transistors are connected to a negative differential input of the each amplifier of the second plurality of amplifiers, and wherein gates of the second and third transistors are driven by the clock phase $\phi_1$.

22. The analog to digital converter of claim 21, wherein the transistors are FET transistors.

23. The analog to digital converter of claim 17, wherein the signal corresponding to the output signal includes positive and negative differential outputs of the track-and-hold amplifier, and further including a transistor connected between the positive and negative differential outputs of the track and hold amplifier, a gate of the transistor being driven by the clock phase $\phi_1$.

24. The analog to digital converter of claim 23, wherein the transistor is a FET transistor.

25. The analog to digital converter of claim 23, further including:

a first reset transistor connected between a reset voltage and the positive differential output;

a second reset transistor connected between the reset voltage and the negative differential output, wherein gates of the first and second reset transistors are driven by the clock phase $\phi_1$.

26. The analog to digital converter of claim 25, wherein the first and second reset transistors are FET transistors.

27. The analog to digital converter of claim 23, further including sampling capacitors at the positive and negative differential outputs of the track-and-hold amplifier.

28. The analog to digital converter of claim 17, wherein each amplifier of the second plurality of amplifiers includes a plurality of amplifier stages, and wherein the switching circuit is coupled to an input of a first stage for each amplifier of the second plurality of amplifiers.

29. The analog to digital converter of claim 17, wherein each amplifier of the second plurality of amplifiers includes a plurality of amplifier stages, and wherein the switching circuit is coupled to inputs of each stage.

30. The analog to digital converter of claim 17, wherein each amplifier of the second plurality of amplifiers includes a plurality of amplifier stages, and wherein the switching circuit is coupled to inputs of alternating stages.

31. The analog to digital converter of claim 17, wherein a transfer function of the switching circuit for common mode is $H_{CM}(\phi_2)=1$, $H_{CM}(\phi_2)=1$.

32. The analog to digital converter of claim 17, further including a sampling capacitor at each input of the first and second plurality of amplifiers for sampling the output of the track-and-hold amplifier.

33. An analog to digital converter comprising:

a multi-phase clock;

a track-and-hold amplifier tracking an input signal with its output signal during one phase of the multi-phase clock and holding a sampled value during another phase of the multi-phase clock;

a first plurality of amplifiers each inputting a signal corresponding to the output signal and a reference voltage;

switching means that receives the signal corresponding to the output signal and responsive to the multi-phase clock, the means substantially passing the signal corresponding to the output signal to a second plurality of amplifiers during the one phase and substantially rejecting the signal corresponding to the output signal during the another phase;

the second plurality of amplifiers inputting, through the switching means, the reference voltages and the output signal, the reference voltages selected based on outputs of the first plurality of amplifiers; and an encoder converting outputs of the first and second plurality of amplifiers to an N-bit digital signal representing the input signal.

34. An analog to digital converter comprising:

a plurality of amplifiers each sampling an input signal at an end of a clock phase $\phi_1$ and each inputting a voltage reference at an end of a clock phase $\phi_2$;

a plurality of fine amplifiers inputting reference voltages and a signal corresponding to the sampled input signal;

a circuit responsive to the clock that receives the signal corresponding to the output signal, the circuit substantially passing the signal corresponding to the output signal and the reference voltages to the amplifiers during the clock phase $\phi_2$ and substantially rejecting the signal corresponding to the output signal during the clock phase $\phi_2$; and an encoder converting outputs of the amplifiers to an N-bit digital signal representing the input signal.

* * * * *